United States Patent
Lu

(10) Patent No.: US 11,804,572 B2
(45) Date of Patent: Oct. 31, 2023

(54) SOLID-STATE LIGHT-EMITTING DEVICE

(71) Applicant: KAISTAR Lighting (Xiamen) Co., Ltd., Xiamen (CN)

(72) Inventor: Tsung-Hong Lu, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 44 days.

(21) Appl. No.: 17/139,358

(22) Filed: Dec. 31, 2020

(65) Prior Publication Data
US 2021/0336082 A1  Oct. 28, 2021

(30) Foreign Application Priority Data
Apr. 27, 2020  (CN) .......................... 202010344668.3

(51) Int. Cl.
*H01L 33/14* (2010.01)
*H01L 33/38* (2010.01)
*H01L 33/62* (2010.01)

(52) U.S. Cl.
CPC .......... *H01L 33/145* (2013.01); *H01L 33/385* (2013.01); *H01L 33/62* (2013.01)

(58) Field of Classification Search
CPC ..... H01L 33/145; H01L 33/385; H01L 33/62; H01L 33/14; H01L 33/36; H01L 33/38; H01L 33/382; H01L 33/387; H01L 33/60; H01L 2224/05124
See application file for complete search history.

(56) References Cited

U.S. PATENT DOCUMENTS

| | | | |
|---|---|---|---|
| 2015/0109803 A1 | 4/2015 | Park et al. | |
| 2017/0179343 A1* | 6/2017 | Chou | ...................... H01L 33/38 |
| 2019/0165208 A1* | 5/2019 | Kim | ...................... H01L 33/145 |

FOREIGN PATENT DOCUMENTS

| | | | | |
|---|---|---|---|---|
| CN | 205692851 U | 11/2016 | | |
| CN | 108183151 A | 6/2018 | | |
| CN | 207489905 U | * 6/2018 | ............. | H01L 33/14 |
| CN | 207977341 U | 10/2018 | | |
| CN | 109983590 A | 7/2019 | | |
| CN | 110429166 A | 11/2019 | | |

(Continued)

OTHER PUBLICATIONS

English translation KR-20120078379-A.*

*Primary Examiner* — Latanya N Crawford Eason
(74) *Attorney, Agent, or Firm* — Zhigang Ma

(57) ABSTRACT

A solid-state light-emitting device includes: a substrate; an epitaxial layer structure on the substrate and including a first-type area and a second-type area; a first current blocking layer disposed on the epitaxial layer structure and located in the first-type area; a current spreading layer covering the first current blocking layer so that the first current blocking layer is located between the current spreading layer and the epitaxial layer structure; a first adhesive reinforcing layer disposed on a side of the current spreading layer away from the first current blocking layer and including a plurality of first through holes; a first electrode disposed on a side of the first adhesion reinforcing layer away from the current spreading layer and filled into the plurality of first through holes to electrically contact with the current spreading layer. Therefore, the light-emitting efficiency of the solid-state light-emitting device is improved.

5 Claims, 5 Drawing Sheets

(56) References Cited

FOREIGN PATENT DOCUMENTS

| EP | 2555255 A2 | | 2/2013 | | |
|----|---|---|---|---|---|
| EP | 3276678 A1 | | 1/2018 | | |
| KR | 20120078379 A | * | 7/2012 | ............ | H01L 33/14 |
| KR | 20190136826 A | | 12/2019 | | |
| TW | 521445 B | | 2/2003 | | |
| TW | M409542 U | | 8/2011 | | |
| TW | 201709553 A | | 3/2017 | | |

* cited by examiner

SOLID-STATE LIGHT-EMITTING DEVICE

FIELD OF THE DISCLOSURE

The disclosure relates to the field of semiconductor technologies, and more particularly to a solid-state light-emitting device.

BACKGROUND OF THE DISCLOSURE

With the continuous development of LED industries, cost-effective advantages of LED products are becoming increasingly prominent. An electrode in a conventional light-emitting diode (LED) is a multi-layer structure, which usually includes a chromium metal layer (Cr), an aluminum metal layer (Al), a titanium metal layer (Ti), a platinum metal layer (Pt) and a gold metal layer (Au) sequentially stacked in that order. A main function of the chromium metal layer is to make the electrode adhere to another layer structure such as an epitaxial layer or a current spreading layer. However, a reflectivity of the chromium metal layer is poor, which seriously reduces a light-emitting efficiency of the LED.

SUMMARY OF THE DISCLOSURE

Accordingly, embodiments of the disclosure provide a solid-state light-emitting device, which can improve the light-emitting efficiency of a solid-state light-emitting device such as a light-emitting diode.

Specifically, an embodiment of the disclosure provides a solid-state light-emitting device including: a substrate; an epitaxial layer structure, disposed on the substrate and including a first-type area and a second-type area; a first current blocking layer, disposed on the epitaxial layer structure and located in the first-type area; a current spreading layer, disposed on the epitaxial layer structure and located in the first-type area, wherein the current spreading layer covers the first current blocking layer and thereby the first current blocking layer is located between the current spreading layer and the epitaxial layer structure; a first adhesion reinforcing layer, disposed on a side of the current spreading layer facing away from the first current blocking layer, and including a plurality of first through holes; and a first electrode, disposed on a side of the first adhesion reinforcing layer facing away from the current spreading layer, wherein the first electrode is filled into the plurality of first through holes and thereby in electrically contact with the current spreading layer, and the first electrode includes a first main portion and a first elongated extension portion extending from the first main portion.

In an embodiment of the disclosure, the first adhesion reinforcing layer where is corresponding to the first main portion is provided with only one of the plurality of first through holes, and the one of the plurality of first through holes is circular or annular in shape.

In an embodiment of the disclosure, the first adhesion reinforcing layer where is corresponding to the first main portion is provided with more than one of the plurality of first through holes distributed in an annular shape.

In an embodiment of the disclosure, the solid-state light-emitting device further includes: a second current blocking layer, disposed on the epitaxial layer structure and located in the second-type area; and a second electrode, disposed on the epitaxial layer structure and located in the second-type area, wherein the second current blocking layer is located between the second electrode and the epitaxial layer structure; wherein the second electrode includes a second main portion and a second elongated extension portion extending from the second main portion.

In an embodiment of the disclosure, the second current blocking layer comprises a main blocking portion corresponding to the second main portion, and a plurality of extended blocking portions corresponding to the second elongated extension portion and spaced from one another; the main blocking portion is provided with at least one second through hole and thereby the second main portion of the second electrode is filled into the at least one second through hole and in electrically contact with the epitaxial layer structure.

In an embodiment of the disclosure, the solid-state light-emitting device further includes: a second adhesion reinforcing layer, disposed between the second current blocking layer and the second electrode.

In an embodiment of the disclosure, the solid-state light-emitting device further includes: a penetration hole, penetrating through the second adhesion reinforcing layer and the second current blocking layer until the epitaxial layer structure, so that the second electrode is filled into the penetration hole and in electrically contact with the epitaxial layer structure.

In an embodiment of the disclosure, the second current blocking layer and the second adhesion reinforcing layer are integrally formed of a same material.

In an embodiment of the disclosure, a material of the first adhesion reinforcing layer is a transparent electrically insulating material, and a light transmittance of the first adhesion reinforcing layer is greater than 85%.

In an embodiment of the disclosure, the first electrode is a metal composite layer, and the metal composite layer along a direction facing away from the substrate comprises an aluminum layer and a plurality of metal layers stacked on the aluminum layer; the aluminum layer extends into the plurality of first through holes and is in direct contact with the first adhesion reinforcing layer and the current spreading layer.

The above technical solutions of the disclosure may have one or more of advantages or benefits as follows. By setting the first adhesion reinforcing layer between the first current blocking layer and the first electrode, and forming the plurality of first through holes on the first adhesion reinforcing layer, the first electrode is disposed in electrically contact with the current spreading layer based on the adhesion between the first electrode and the first adhesion reinforcing layer, and the second electrode is disposed in electrically contact with the epitaxial layer structure based on the adhesion between the second electrode and the second current blocking layer, which can avoid the problem of poor direct contact adhesion between the aluminum layer in the electrode and the current spreading layer or the epitaxial layer structure, avoid the use of a chromium metal layer in the electrode, and thereby improve the light-emitting efficiency of the solid-state light-emitting device such as a light-emitting diode, reduce an absorptivity of photons by the electrode, and improve the reflectivity of the electrode. In addition, the second adhesion reinforcing layer is arranged between the second electrode and the second current blocking layer, which further increases the adhesion between the second electrode and the epitaxial layer structure.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

FIG. 1b is a cross-sectional view of the solid-state light-emitting device according to the first embodiment, taken along the line A-A in FIG. 1a.

FIG. 2b is a cross-sectional view of the solid-state light-emitting device according to the second embodiment, taken along the line A-A in FIG. 2a.

FIG. 3b is a cross-sectional view of the another solid-state light-emitting device according to the second embodiment, taken along the line A-A in FIG. 3a.

DETAILED DESCRIPTION OF EMBODIMENTS

The technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protection scope of the disclosure.

It should be noted that the terms "first" and "second" in the description and claims of the disclosure and the above drawings are used to distinguish similar objects, rather than to limit a specific order or sequence. It should be understood that the terms used in this way can be interchanged under appropriate circumstances so that the embodiments of the disclosure described herein can be implemented in an order other than those illustrated or described herein. In addition, the terms "including" and "having" and any variations thereof are intended to cover non-exclusive inclusions, for example, a process, method, system, product or device containing a series of steps or units need not be limited to the clearly listed step(s) or unit(s), but may include other step(s) or unit(s) not explicitly listed or inherent to the process, method, system, product or device.

First Embodiment

Figure 1A:
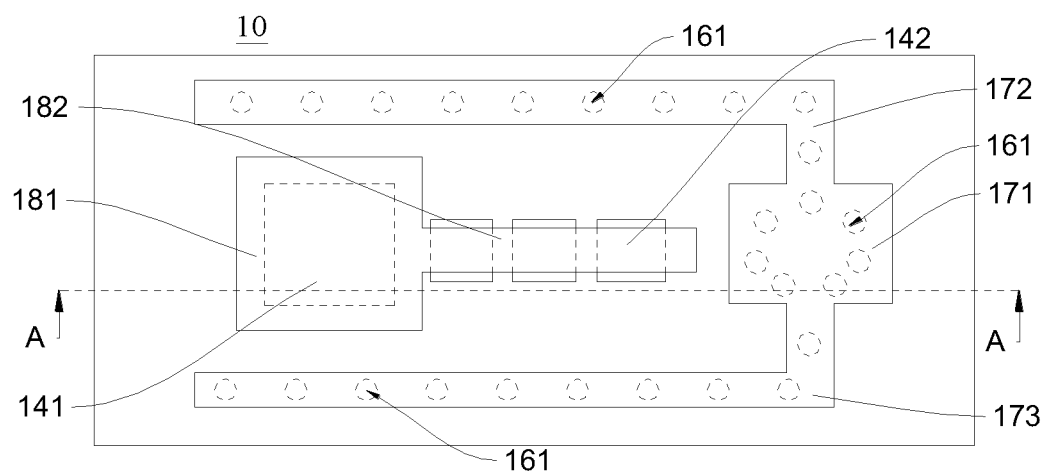
FIG. 1a is a partial schematic structural view of a solid-state light-emitting device according to a first embodiment of the disclosure, for the purpose of illustrating electrodes, current blocking layers and an adhesion reinforcing layer.
Figure 1B:
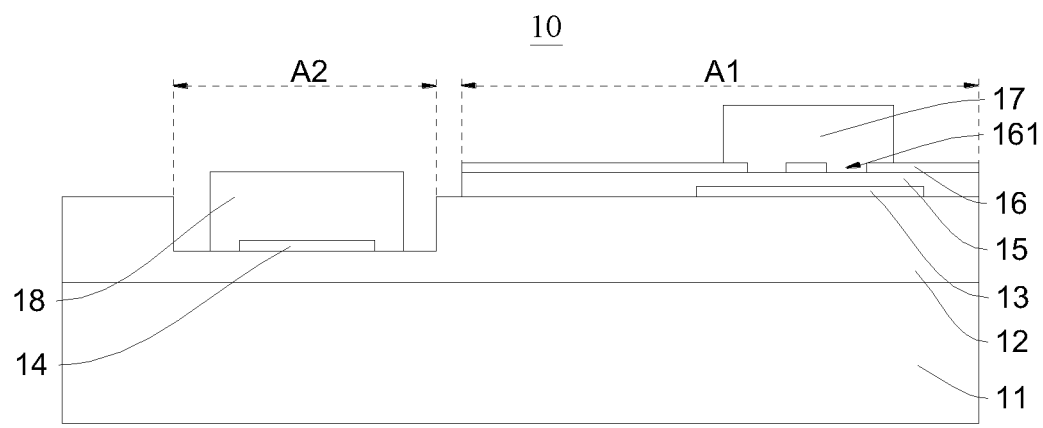

Referring to FIG. 1a and FIG. 1b, the first embodiment of the disclosure provides a solid-state light-emitting device such as a light-emitting diode (LED). As illustrated in FIG. 1b, the solid-state light emitting device 10 includes, for example, a substrate 11, an epitaxial layer structure 12, a first current blocking layer 13, a second current blocking layer 14, a current spreading layer 15, a first adhesion reinforcing layer 16, a first electrode 17 and a second electrode 18.

The epitaxial layer structure 12 is disposed on the substrate 11 and includes a first-type area A1 and a second-type area A2. The first current blocking layer 13 is disposed on the epitaxial layer structure 12 and located in the first-type area A1. The second current blocking layer 14 is disposed on the epitaxial layer structure 12 and located in the second-type area A2. The current spreading layer 15 is disposed on the epitaxial layer structure 12 and located in the first-type area A1; the current spreading layer 15 covers the first current blocking layer 13 so that the first current blocking layer 13 is located between the current spreading layer 15 and the epitaxial layer structure 12. The first adhesion reinforcing layer 16 is disposed on a side of the current spreading layer 15 facing away from the first current blocking layer 13, and includes a plurality of first through holes 161. The first electrode 17 is disposed on a side of the first adhesion reinforcing layer 16 facing away from the current spreading layer 15 and filled into the plurality of first through holes 161 and thereby in electrically contact with the current spreading layer 15. The second electrode 18 is disposed on the epitaxial layer structure 12 and located in the second-type area A2; the second electrode 18 covers the second current blocking layer 14 so that the second current blocking layer 14 is located between the second electrode 18 and the epitaxial layer structure 12.

The substrate 11 is for example a semiconductor material such as one of silicon, sapphire and silicon carbide, or other material well known to those skilled in the art that is suitable for growing a gallium nitride material.

The epitaxial layer structure 12 is a multi-layered structure, for example, the epitaxial layer structure 12 upwards from the substrate 11 at least includes a N-type GaN epitaxial layer, a multiple quantum well light-emitting layer and a P-type GaN epitaxial layer. The first-type area A1 is for example a P-type area, the second-type area A2 is for example a N-type area, the second-type area A2 is formed for example by etching in the MESA process, for instance, etching off the P-type GaN epitaxial layer, the multiple quantum well light-emitting layer and a part of the N-type GaN epitaxial layer of the epitaxial layer structure 12 corresponding to the N-type area and retaining another part of the N-type GaN epitaxial layer.

The first current blocking layer 13 is an electrically insulating layer. The first current blocking layer 13 may block a current spreading between the the P-type GaN epitaxial layer of the lower epitaxial layer structure 12 and the upper current spreading layer 15, and guide a current towards an area far away from the first electrode 17 through the first current blocking layer 13 to reduce a current crowding near the first electrode 17 and improve a light-output power, so that the light-emitting efficiency of the solid-state light-emitting device is improved and the brightness is increased.

The second current blocking layer 14 is an electrically insulating layer, and the second current blocking layer 14 may block a current spreading between the the N-type GaN epitaxial layer of the lower epitaxial layer structure 12 and the upper second electrode 18, and guide a current towards an area far away from the second electrode 18 through the second current blocking layer 14 to reduce a current crowding near the second electrode 18 and improve a light-output power, so that the light-emitting efficiency of the solid-state light-emitting device is improved and the brightness is increased.

Specifically, the first current blocking layer 13 and the second current blocking layer 14 each are made of a material such as silicon dioxide, titanium dioxide, aluminum oxide, silicon nitride, or any one of combinations thereof.

The current spreading layer 15 is a transparent layer and configured (i.e., structured and arranged) for performing functions of conduction and current spreading, thereby solving the problem of weak current lateral spreading ability at the P-type GaN epitaxial layer of the epitaxial layer structure 12. For instance, the current spreading layer 15 is for example an ITO (indium-tin oxide) current spreading layer, also referred to as an ITO transparent electrically conductive layer. In addition, the current spreading layer 15 may also be ZITO, ZIO, GIO, FTO, AZO, GZO, $In_4Sn_3O_{12}$ or NiAu current spreading layer.

A material of the first adhesion reinforcing layer 16 is a transparent electrically insulating material, such as silicon dioxide, aluminum oxide, silicon nitride or other transparent electrically insulating material. A light transmittance of the first adhesion reinforcing layer 16 is greater than 85%.

The first electrode 17 and the second electrode 18 are, for example, a metal composite layer, and the metal composite layer along a direction facing away from the substrate 11 includes an aluminum layer and a plurality of metal layers stacked on the aluminum layer, the multiple metal layers include a titanium layer, a platinum layer and a gold layer in turn. The aluminum layer of the first electrode 17 extends into the plurality of first through holes 161 and is in direct contact with the first adhesion reinforcement layer 16 and the current spreading layer 15. The aluminum layer of the second electrode 18 is in direct contact with the second current blocking layer 14. The second current blocking layer 14 not only plays the role of isolating the current spreading, but also acts as the adhesion reinforcing layer of the second electrode 18. In the prior art, the electrode is of a five-layered metal structure and the metal layer close to the substrate side generally is a chromium metal layer. Based on the electrode structure in the prior art, the chromium metal layer is removed in the disclosure. Based on a good adhesion between the aluminum layer and the transparent electrically insulating material, that is, the adhesion between the aluminum layer of the first electrode 17 and the first adhesion reinforcing layer 16, and the adhesion between the aluminum layer of the second electrode 18 and the second current blocking layer 14, so that the first electrode 17 and the second electrode 18 are fixed, a current on the first electrode 17 passes through a plurality of first through holes 161 of the first adhesion reinforcing layer 16, and a current on the second electrode 18 passes through the adhesion between the second electrode 18 and the epitaxial layer structure 12, thereby improving the light-emitting efficiency of the solid-state light-emitting device.

Further, as shown in FIG. 1a, the first electrode 17 includes, for example, a first main portion 171 and a first elongated extension portion 172 extending from the first main portion 171 in a direction away from the first main portion 171; the second electrode 18 includes a second main portion 181 and a second elongated extension portion 182 extending from the second main portion 181 in a direction far away from the second main portion 181. In a preferred embodiment, the first elongated extension 172 extends in a direction relatively approaching the second main portion 181 of the second electrode 18, and the second elongated extension portion 182 extends in a direction relatively approaching the first main portion 171 of the first electrode 17.

Furthermore, the first electrode 17 may also include a third elongated extension portion 173 extending from the first main portion 171 in a direction relatively approaching the second main portion 181. In this embodiment, the first elongated extension portion 172 and the third elongated extension portion 173 may be located on two opposite sides of the first main portion 171, that is, the second elongated extension portion 182 is located between the first elongated extension portion 172 and the third elongated extension portion 173. Of course, this embodiment is not limited to the shapes of the first electrode 17 and the second electrode 18 illustrated in FIG. 1a. The shapes of the first electrode 17 and the second electrode 18 illustrated in FIG. 1A are only for better understanding of this embodiment. In addition, the first main portion 171 may also be circular, the first elongated extension portion 172 and the third elongated extension portion 173 are long strip-shaped; the first main portion 171 is mainly used for connecting an external voltage, and the first elongated extension portion 172 and the third elongated extension portion 173 may help to spread the current. The second main portion 181 may also be circular, the second elongated extension portion 182 may be long strip-shaped, the second main portion 181 is mainly used for connecting external voltage, and the second elongated extension portion 182 can help to spread the current. The first electrode 17 is for example an anode, and the second electrode 18 is for example a cathode.

Further, the second current blocking layer 14 includes, for example, a main blocking portion 141 corresponding to the second main portion 181 and a plurality of extended blocking portions 142 corresponding to the second elongated extension portion 182 and spaced from one another. And it can be seen from FIG. 1b that, the second electrode 18 surrounds the second current blocking layer 14 to electrically contact with the epitaxial layer structure 12, that is, the width of the second current blocking layer 14 (e.g., in the horizontal direction of FIG. 1a) is smaller than that of the second electrode 18 in the horizontal direction of FIG. 1a.

It should be noted that, the second electrode 18 for example completely covers the second current blocking layer 14, so that the second current blocking layer 14 is located between the second electrode 18 and the epitaxial layer structure 12. Of course, the second electrode 18 may cover the second current blocking layer 14 partly. For example, the main blocking portion 141 of the second current blocking layer 14 is provided with a through hole, the second main portion 181 of the second electrode for example fill into the through-hole to contact the epitaxial layer structure 12.

In addition, in other embodiment of the disclosure, the second current blocking layer 14 mentioned above may not be provided with the plurality of extension blocking portions 142 with spacings as mentioned above, for example, an extension blocking portion of an one-piece structure corresponding to the second elongated extension portion 182, which can be integrally formed with the main blocking portion 141, and a plurality of through holes are disposed on the extension blocking portion to replace conductive spacings which are formed between the plurality of extension blocking portions 142 spaced from one another.

Further, the first adhesion reinforcing layer 16 may completely cover the current spreading layer 15 and protect the current spreading layer 15; in other embodiments, the first adhesion reinforcing layer 16 may have a similar contour with the first electrode 17, for example, including an adhesion enhancement main portion corresponding to the first main portion 171 and being of a similar size to the first main portion 171, and an elongated extension portion corresponding to the first elongated extension portion part 172 and being of a similar size to the first elongated extension portion part 172. The first adhesion reinforcing layer 16 where is corresponding to the first main portion 171 is provided with at least one first through hole 161, and the first adhesion reinforcing layer 16 where is corresponding to the first elongated extension portion 172 and/or the third elongated extension portion 173 include(s) a plurality of first through holes 161. In some embodiments, the size and shape of the first through holes 161 may be variable.

Figure 1C:
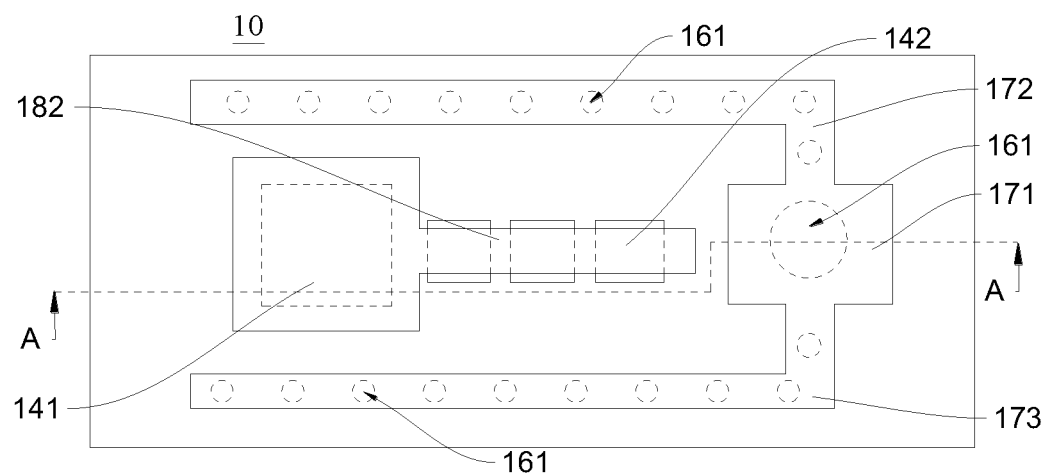
FIG. 1c is a partial schematic structural view of another solid-state light-emitting device according to the first embodiment of the disclosure, for the purpose of illustrating electrodes, current blocking layers and an adhesion reinforcing layer.
Figure 1D:
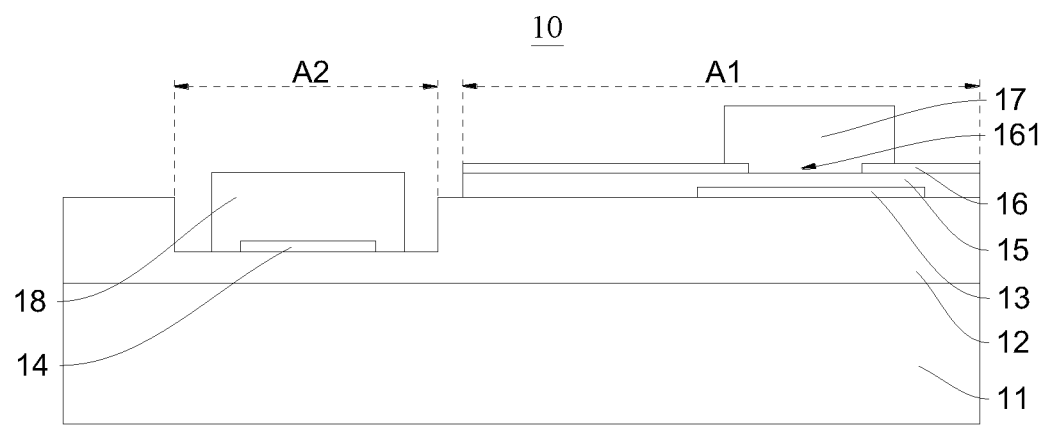
FIG. 1d is a cross-sectional view of the another solid-state light-emitting device according to the first embodiment, taken along the line A-A in FIG. 1c.

Specifically, as illustrated in FIG. 1*a* and FIG. 1*b*, the first adhesion reinforcing layer 16 where is corresponding to the first main portion 171 is provided with a plurality of first through holes 161 distributed in an annular shape, and the first adhesion reinforcing layer 16 where is corresponding to the first elongated extension portion 172 and/or the third elongated extension portion 173 is provided with a plurality of first through holes 161; in this embodiment, each first through hole 161 may be of a same shape or size, or equally spaced-set from one another. Of course, the embodiment of the disclosure is not limited to this. As illustrated in FIG. 1*c* and FIG. 1D, the first adhesion reinforcing layer 16 where is corresponding to the first main portion 171 is provided with a first through hole 161 at the central position, which is circular, and can also be annular in other embodiments; the adhesion reinforcing layer 16 where is corresponding to the first elongated extension portion part 172 and/or the third elongated extension portion 173 is provided with a plurality of first through holes 161; in this embodiment, each of the first through holes 161 may be of different shapes or sizes.

It should be noted that, the first adhesion reinforcing layer 16 may not completely cover the current spreading layer 15 or have a contour similar to that of the first electrode 17, and the first adhesion reinforcing layer 16 can also be locally and intermittently set between the first electrode 17 and the current blocking layer 15. In this case, the first through holes 161 is not necessary; the first adhesion reinforcing layer 16 mainly realizes the improvement of the adhesion effect between the first electrode 17 and the current blocking layer 15.

To sum up, the solid-state light-emitting device provided by this embodiment is provided with the first adhesion reinforcing layer between the first current blocking layer and the first electrode, and the plurality of first through holes disposed on the first adhesion reinforcing layer, so that the first electrode adheres to the first adhesion reinforcing layer, and is electrically contacted with the current spreading layer based on the adhesion between the first electrode and the first adhesion reinforcing layer. And Based on the adhesion between the second electrode and the second current blocking layer, the second electrode is disposed electrically contacted with the epitaxial layer structure, so as to avoid the problem of poor direct contact adhesion between the aluminum metal layer in the electrode and the current spreading layer or the epitaxial layer structure, avoid the use of a chromium metal layer in the electrode, and thereby improve the light-emitting efficiency of the LED, reduce the absorptivity of photons by the electrode, and improve the reflectivity of the electrode.

Second Embodiment

Figure 2A:
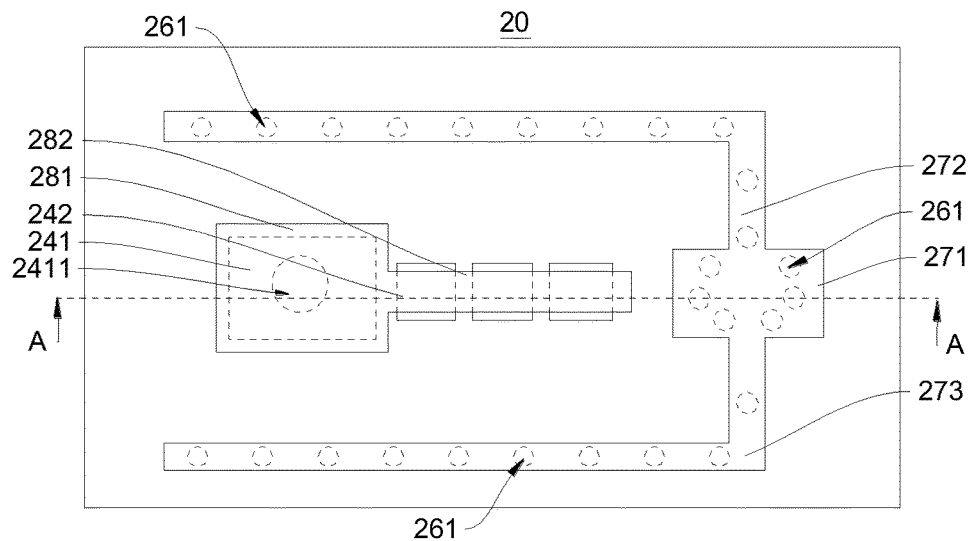
FIG. 2a is a partial schematic structural view of a solid-state light-emitting device according to a second embodiment of the disclosure, for the purpose of illustrating electrodes, current blocking layers and an adhesion reinforcing layer.
Figure 2B:
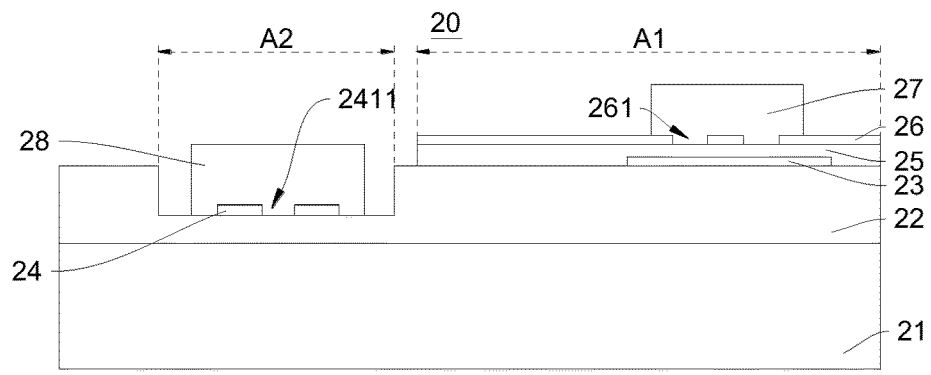

Referring to FIG. 2*a* and FIG. 2*b*, the second embodiment of the disclosure discloses a solid-state light-emitting device. As illustrated in FIG. 2*a* and FIG. 2*b*, the solid-state light-emitting device 20 is similar to the solid-state light-emitting device 10. For example, the solid-state light-emitting device 20 includes: a substrate 21, an epitaxial layer structure 22, a first current blocking layer 23, a second current blocking layer 24, a current spreading layer 25, a first adhesion reinforcing layer 26, a first electrode 27 and a second electrode 28.

Specifically, the epitaxial layer structure 22 is disposed on the substrate 21 and includes a first-type area A1 and a second-type area A2. The first current blocking layer 23 is disposed on the epitaxial layer structure 22 and located in the first-type area A1. The second current blocking layer 24 is disposed on the epitaxial layer structure 22 and located in the second-type area A2. The current spreading layer 25 is disposed on the epitaxial layer structure 22 and located in the first-type area A1, wherein the current spreading layer 25 covers the first current blocking layer 23 so that the first current blocking layer 23 is located between the current spreading layer 25 and the epitaxial layer structure 22. The first adhesion reinforcing layer 26 is disposed on a side of the current spreading layer 25 facing away from the first current blocking layer 23, and includes a plurality of first through holes 261. The first electrode 27 is disposed on a side of the first adhesion reinforcing layer 26 facing away from the current spreading layer 25 and extends into the plurality of first through holes 261 to electrically contact with the current spreading layer 25. The second electrode 28 is disposed on the epitaxial layer structure 22 and located in the second-type area A2, wherein the second current blocking layer 24 is located between the second electrode 28 and the epitaxial layer structure 22.

As illustrated in FIG. 2*a*, the first electrode 27 includes a first main portion 271 and a first elongated extension portion 272 and a third elongated extension portion 273 extending from two opposite sides of the first main portion 271 in a direction relatively close to the second electrode 28, and the second electrode 28 includes a second main portion 281 and a second elongated extension portion 282 extending from the second main portion 281 in a direction relatively close to the first electrode 27, the second elongated extension portion 282 is located between the first elongated extension portion 272 and the third elongated extension portion 273. Of course, this embodiment is not limited to the shapes of the first electrode 27 and the second electrode 28 shown in FIG. 2*a*. The shapes of the first electrode 27 and the second electrode 28 shown in FIG. 2*a* are only for better understanding of this embodiment. The second current blocking layer 24 of the solid-state light emitting device 20 includes a main blocking portion 241 corresponding to the second main portion 281 and a plurality of extended blocking portions 242 corresponding to the second elongated extension portion 282 and spaced from one another.

The difference between the solid-state light-emitting device 20 and the solid-state light-emitting device 10 is that, at least one second through hole 2411 is disposed on the main blocking portion 241 of the second current blocking layer 24, so that the second main portion 281 of the second electrode 28 fills into the at least one second through hole 2411 and electrically contacts with the epitaxial layer structure 22. That is, the solid-state light-emitting device 20 of this embodiment is provided with at least one second through hole 2411 on the second main portion 281 corresponding to the main blocking portion 241 to enlarge the contact area and enhance the connection strength between the second electrode 28 and the epitaxial layer structure 22.

Figure 3A:
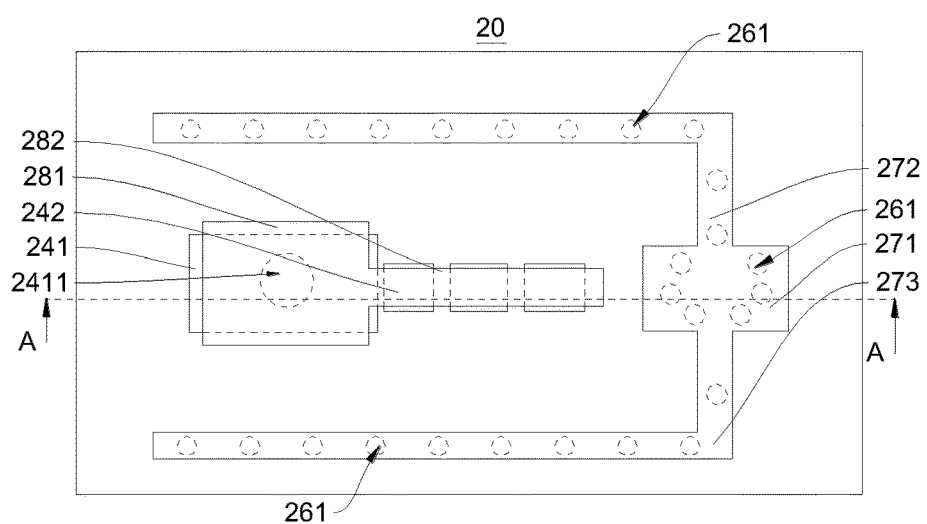
FIG. 3a is a partial schematic structural view of another solid-state light-emitting device according to the second embodiment of the disclosure, for the purpose of illustrating electrodes, current blocking layers and an adhesion reinforcing layer.
Figure 3B:
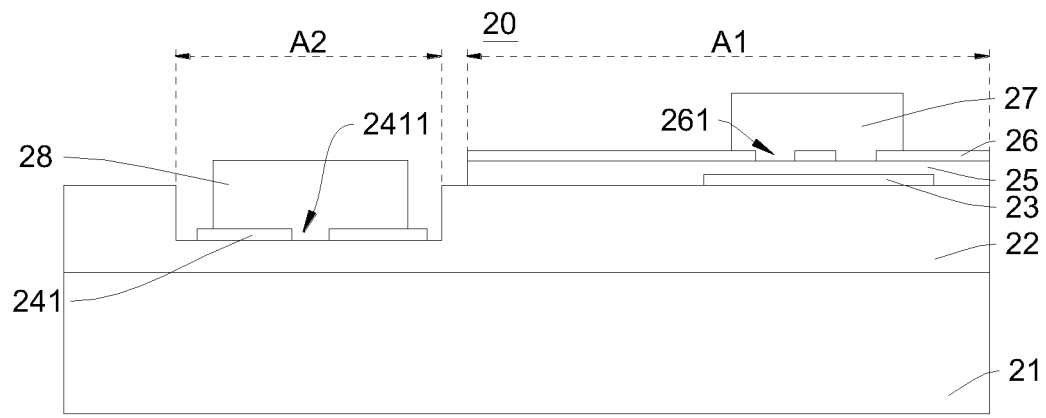

In other embodiments, as illustrated in FIG. 3a and FIG. 3b, the width of the main blocking portion 241 (e.g., in the horizontal direction of FIG. 3a) of the second current blocking layer 24 of the solid-state light emitting device 20 provided by this embodiment may also be larger than the width of the second main portion 281 of the second electrode 28 in the horizontal direction of FIG. 3a. For example, in a direction of approaching the first electrode 27, the width of the main blocking portion 241 is larger than that of the second main portion 281 of the second electrode 28. Of course, this embodiment is not limited to this. By increasing the contact area between the second electrode 28 and the second current blocking layer 24, the connection strength between the second electrode 28 and the epitaxial layer structure 22 is further increased, and at least one second through hole 2411 is arranged to ensure the current conduction.

Third Embodiment

Figure 4:
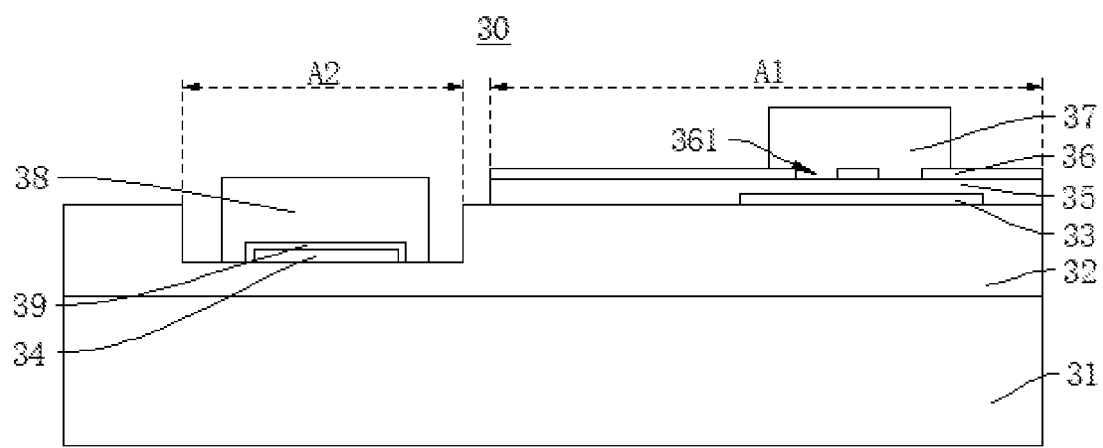
FIG. 4 is a partial schematic structural view of a solid-state light-emitting device according to a third embodiment of the disclosure.

Referring to FIG. 4, a third embodiment of the disclosure provides a solid-state light-emitting device. As illustrated in FIG. 4, the solid-state light-emitting device 30 is similar to the solid-state light-emitting device 10, for example, including: a substrate 31, an epitaxial layer structure 32, a first current blocking layer 33, a second current blocking layer 34, a current spreading layer 35, a first adhesion reinforcing layer 36, a first electrode 37 and a second electrode 38.

The epitaxial layer structure 32 is disposed on the substrate 31 and includes a first-type area A1 and a second-type area A2. The first current blocking layer 33 is disposed on the epitaxial layer structure 32 and located in the first-type area A1. The second current blocking layer 34 is disposed on the epitaxial layer structure 32 and located in the second-type area A2. The current spreading layer 35 is disposed on the epitaxial layer structure 32 and located in the first-type area A1, wherein the current spreading layer 35 covers the first current blocking layer 33 so that the first current blocking layer 33 is located between the current spreading layer 35 and the epitaxial layer structure 32. The first adhesion reinforcing layer 36 is disposed on a side of the current spreading layer 35 facing away from the first current blocking layer 33, and includes a plurality of first through holes 361. The first electrode 37 is disposed on a side of the first adhesion reinforcing layer 36 facing away from the current spreading layer 35 and extends into the plurality of first through holes 361 to electrically contact with the current spreading layer 35. The second electrode 38 is disposed on the epitaxial layer structure 32 and located in the second-type area A2, wherein the second electrode 38 covers the second current blocking layer 34 so that the second current blocking layer 34 is located between the second electrode 38 and the epitaxial layer structure 32.

The difference between the solid-state light-emitting device 30 and the solid-state light-emitting device 10 is that, the solid-state light-emitting device 30 further includes a second adhesion reinforcing layer 39 disposed between the second current blocking layer 34 and the second electrode 38; in some embodiments, the second adhesion reinforcing layer 39 may surround the second current blocking layer 34 to contact with the epitaxial layer structure 32.

The material of the second adhesion reinforcing layer 39 is the same as that of the first adhesion reinforcing layer 36, for example, it is a transparent insulating material, for example, silicon dioxide, aluminum oxide, silicon nitride or other transparent electrically insulating material, and a light transmittance of the second adhesion reinforcing layer 39 is greater than 85%. Of course, the second adhesion reinforcing layer 39 referred to in this embodiment may not surround the second current blocking layer 34, but only be disposed above the second current blocking layer 34. By the second adhesion reinforcing layer 39 set between the second current blocking layer 34 and the second electrode 38, the connection strength between the second electrode 38 and the epitaxial layer structure 32 is further strengthened based on the adhesion between the second adhesion reinforcing layer 39 and the second electrode 38. At the same time, the second electrode 38 contacts with the epitaxial layer 32 around the second adhesion reinforcing layer 39 and the second current blocking layer 34 to ensure the current conduction.

Fourth Embodiment

Figure 5:
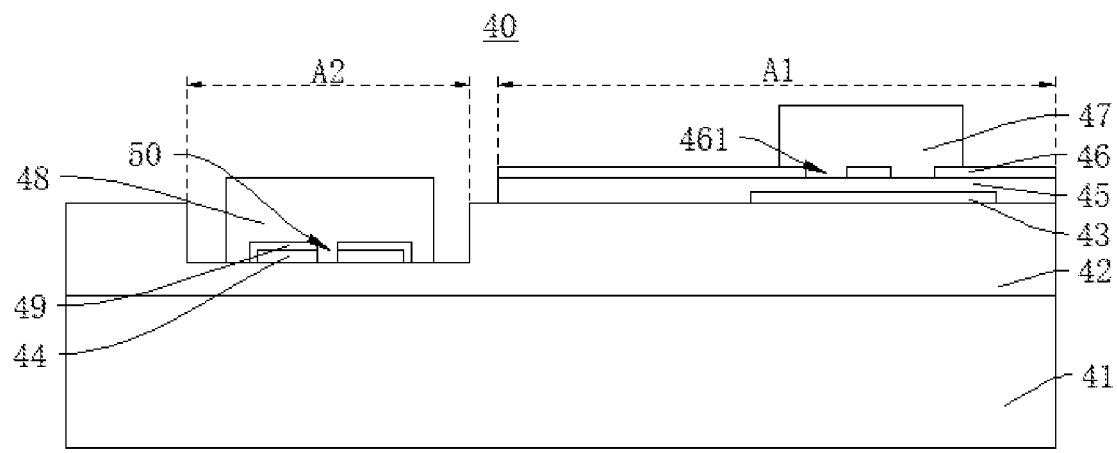
FIG. 5 is a partial schematic structural view of a solid-state light-emitting device according to a fourth embodiment of the disclosure.

Referring to FIG. 5, the fourth embodiment of the disclosure provides a solid-state light-emitting device. As illustrated in FIG. 5, the solid-state light-emitting device 40 is similar to the solid-state light-emitting device 30, for example, including: a substrate 41, an epitaxial layer 42, a first current blocking layer 43, a second current blocking layer 44, a current spreading layer 45, a first adhesion reinforcing layer 36, a first electrode 47, a second electrode 48 and a second adhesion reinforcing layer 49.

The epitaxial layer structure 42 is disposed on the substrate 41 and includes a first-type area A1 and a second-type area A2. The first current blocking layer 43 is disposed on the epitaxial layer structure 42 and located in the first-type area A1. The second current blocking layer 44 is disposed on the epitaxial layer structure 42 and located in the second-type area A2. The current spreading layer 45 is disposed on the epitaxial layer structure 42 and located in the first-type area A1, wherein the current spreading layer 45 covers the first current blocking layer 43 so that the first current blocking layer 43 is located between the current spreading layer 45 and the epitaxial layer structure 42. The first adhesion reinforcing layer 46 is disposed on a side of the current spreading layer 45 facing away from the first current blocking layer 43, and includes a plurality of first through holes 461. The first electrode 47 is disposed on a side of the first adhesion reinforcing layer 46 facing away from the current spreading layer 45 and extends into the plurality of first through holes 461 to electrically contact with the current spreading layer 45. The second electrode 48 is disposed on the epitaxial layer structure 42 and located in the second-type area A2, wherein the second electrode 48 covers the second current blocking layer 44 so that the second current blocking layer 44 is located between the second electrode 48 and the epitaxial layer structure 42, and the second adhesion reinforcing layer 49 is disposed between the second current blocking layer 44 and the second electrode 48, and surrounds the second current blocking layer 44 and is in contact with the epitaxial layer structure 42.

The difference between the solid-state light-emitting device 40 and the solid-state light-emitting device 30 is that, the solid-state light-emitting device 40 further includes a penetration hole 50, the penetration hole 50 penetrates through the second adhesion reinforcing layer 49 and the second current blocking layer 44 until the epitaxial layer structure 42, so that the second electrode 48 is filled into the penetration hole 50 and in electrically contact with the epitaxial layer structure 42. The solid-state light-emitting device 40 disclosed by this embodiment enlarges the contact area and enhances the connection strength of the second electrode 48 and the epitaxial layer structure 42 by setting the penetration hole 50 penetrating the second adhesion reinforcing layer 49 and the second current blocking layer 44. This embodiment does not limit the specific number of the penetration hole 50.

Figure 6:
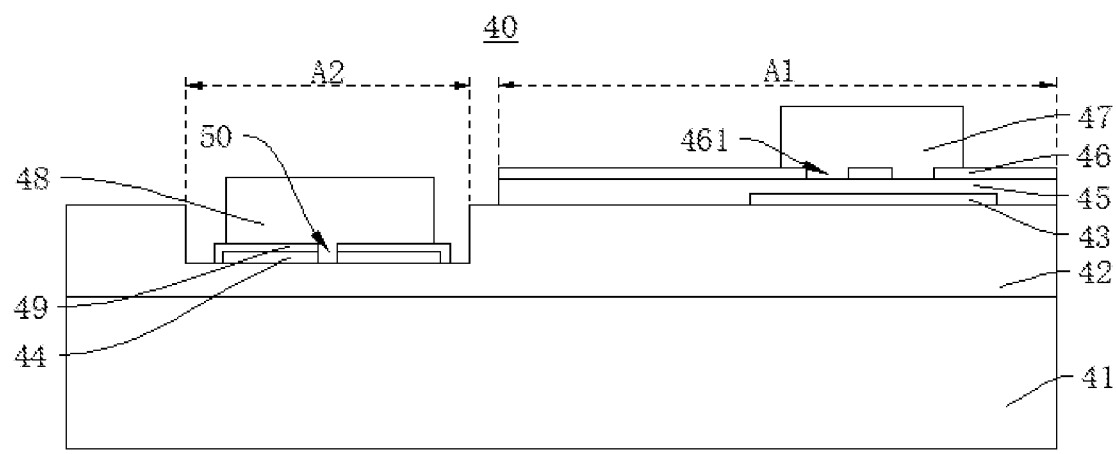
FIG. 6 is a partial schematic structural view of another solid-state light-emitting device according to the fourth embodiment of the disclosure.

Furthermore, as illustrated in FIG. 6, the width of the second adhesion reinforcing layer 49 (in the horizontal direction of FIG. 6) of the solid-state light emitting device 40 provided by this embodiment may be larger than the width of the second electrode 48 in the horizontal direction of FIG. 6. For example, in a direction of approaching the first electrode 47, the width of the second adhesion reinforcing layer 49 is larger than the width of the second electrode 48. Of course, this embodiment is not limited to this. In this way, by increasing the contact area between the second electrode 48 and the second adhesion reinforcing layer 49, the connection strength between the second electrode 48 and the epitaxial layer structure 42 is further increased, and the penetration hole 50 is set to ensure the current conduction.

Furthermore, the width of the second current blocking layer 44 (in the horizontal direction of FIG. 6) may be larger than that of the second electrode 48 in the horizontal direction of FIG. 6. In this way, the effect of current spreading between the epitaxial layer structure 42 and the second electrode 48 is further enhanced, so as to improve the light-emitting efficiency and brightness of the solid-state light-emitting device.

In this application, since the second current blocking layer may be made of the same material as the second adhesion reinforcing layer, the second current blocking layer is used as the second adhesion reinforcing layer; In other words, for example, the second current blocking layer and the second attached reinforcing layer may be made of the same material by integral molding, and There is not necessarily a clear boundary between the two, and the connection strength between the second electrode 48 and the epitaxial layer structure 42 may also be increased.

Finally, it should be noted that the above embodiments are only used to illustrate the technical solutions of the invention, rather than to limit the invention. Although the invention has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the invention.

What is claimed is:

1. A solid-state light-emitting device, comprising:
a substrate;
an epitaxial layer structure, disposed on the substrate and comprising a first-type area and a second-type area;
a first current blocking layer, disposed on the epitaxial layer structure and located in the first-type area;
a current spreading layer, disposed on the epitaxial layer structure and located in the first-type area, wherein the current spreading layer covers the first current blocking layer and thereby the first current blocking layer is located between the current spreading layer and the epitaxial layer structure;
a first adhesion reinforcing layer, disposed on a side of the current spreading layer facing away from the first current blocking layer, and comprising a plurality of first through holes;
a first electrode, disposed on a side of the first adhesion reinforcing layer facing away from the current spreading layer, wherein the first electrode is filled into the plurality of first through holes and thereby in electrically contact with the current spreading layer, and the first electrode comprises a first main portion and a first elongated extension portion extending from the first main portion;
a second current blocking layer, disposed on the epitaxial layer structure and located in the second-type area;
a second electrode, disposed on the epitaxial layer structure and located in the second-type area, wherein the second current blocking layer is located between the second electrode and the epitaxial layer structure;
a second adhesion reinforcing layer, disposed between the second current blocking layer and the second electrode; and
a penetration hole, penetrating through the second adhesion reinforcing layer and the second current blocking layer until the epitaxial layer structure, so that the second electrode is filled into the penetration hole and in electrically contact with the epitaxial layer structure;
wherein the first electrode is a metal composite layer, and the metal composite layer along a direction facing away from the substrate comprises an aluminum layer and a plurality of metal layers stacked on the aluminum layer; the aluminum layer extends into the plurality of first through holes and is in direct contact with the first adhesion reinforcing layer and the current spreading layer.

2. The solid-state light-emitting device as claimed in claim 1, wherein the first adhesion reinforcing layer where is corresponding to the first main portion is provided with only one of the plurality of first through holes, and the one of the plurality of first through holes is circular or annular in shape.

3. The solid-state light-emitting device as claimed in claim 1, wherein the first adhesion reinforcing layer where is corresponding to the first main portion is provided with more than one of the plurality of first through holes distributed in an annular shape.

4. The solid-state light-emitting device as claimed in claim 1,
wherein the second electrode comprises a second main portion and a second elongated extension portion extending from the second main portion.

5. The solid-state light-emitting device as claimed in claim 4, wherein the second current blocking layer comprises a main blocking portion corresponding to the second main portion, and a plurality of extended blocking portions corresponding to the second elongated extension portion and spaced from one another; the main blocking portion is provided with at least one second through hole and thereby the second main portion of the second electrode is filled into the at least one second through hole and in electrically contact with the epitaxial layer structure.

* * * * *